(12) United States Patent
Caty et al.

(10) Patent No.: US 7,062,694 B2
(45) Date of Patent: Jun. 13, 2006

(54) CONCURRENTLY PROGRAMMABLE DYNAMIC MEMORY BUILT-IN SELF-TEST (BIST)

(75) Inventors: Olivier Caty, San Jose, CA (US); Ismet Bayraktaroglu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 340 days.

(21) Appl. No.: 10/360,959

(22) Filed: Feb. 7, 2003

(65) Prior Publication Data

US 2004/0158786 A1    Aug. 12, 2004

(51) Int. Cl.
  G01R 31/28    (2006.01)
  G11C 29/00    (2006.01)
  G06F 11/00    (2006.01)
(52) U.S. Cl. .......................... 714/733; 714/718; 714/31
(58) Field of Classification Search ................ 714/733, 714/743, 735, 736, 718, 739, 724, 25, 31, 714/35, 42, 54, 48, 49, 50
See application file for complete search history.

(56) References Cited

U.S. PATENT DOCUMENTS

| | | | |
|---|---|---|---|
| 3,783,254 A | | 1/1974 | Eichelberger |
| 5,173,906 A | | 12/1992 | Dreibelbis et al. |
| 5,675,545 A | | 10/1997 | Madhavan et al. |
| 6,067,262 A | | 5/2000 | Irrinki et al. |
| 6,088,823 A | | 7/2000 | Ayres et al. |
| 6,230,290 B1 | * | 5/2001 | Heidel et al. ............... 714/718 |
| 6,249,892 B1 | * | 6/2001 | Rajsuman et al. .......... 714/741 |
| 6,760,865 B1 | | 7/2004 | Ledford et al. |
| 6,834,361 B1 | * | 12/2004 | Abbott ........................ 714/42 |
| 6,874,111 B1 | * | 3/2005 | Adams et al. ............... 714/733 |

OTHER PUBLICATIONS

"What is Embedded Test?", http://www.logicvision.com/embedded/index.html.
"A Programmable BIST Core for Embedded DRAM", Huang, et al. National Tsing Hua University, Jan.-Mar. 1999.
"What Is Build-In Self Test and Why Do We Need It?", Richard L. Campbell, EE-Evaluation Engineering, Mar. 1996, pp. 20, 22, 24, 26 and Figs. 1-3.
"Processor-Based Built-In Self-Test for Embedded DRAM", Dreibelbis, et al. IEEE Journal of Solid-State Circuits, vol. 33, No. 11, Nov. 1998, pp. 1731-1740.
"Mentor Graphics Announces Design-for-Test Support for Artisan Components' Flex-Repair™ Memories," Wilsonville, Oregon, http//www.mentor.com/products/dft/news/flex-repair.cfm, (Sep. 17, 2002).

(Continued)

Primary Examiner—Christine T. Tu
(74) Attorney, Agent, or Firm—Blakely, Sokoloff, Taylor & Zafman LLP

(57) ABSTRACT

Disclosed are novel methods and apparatus for efficiently providing concurrently programmable dynamic memory built-in self-testing (BIST). In an embodiment of the present invention, a method of utilizing a BIST system is disclosed. The method includes: loading setup data into a configuration register; loading a first instruction into a shift register; loading the first instruction into an update register; executing the loaded first instruction to perform a memory test; upon receiving a first update command, loading a second instruction into the shift register; and upon receiving a second update command, loading the second instruction into the update register.

20 Claims, 3 Drawing Sheets

OTHER PUBLICATIONS

Michael Santarini, "PDF Solutions, Logic Vision file for IPOs," EE Times: Design News, San Mateo, California (Aug. 18, 2000).

"TetraMAX, Mentor FastScan & test Kompress, LogicVision, Genesys," ESNUG, DAC 02 Item 11, http://www.deepchip.com/items/dac02-11.html, (Sep. 10, 2002).

"Corelis and LogicVision Team to Provide Customers With Innovative and Affordable Test Solutions For Components, Boards, and Systems," Cerritos, California, http://www.corelis.com/news/pr-LogicVision.htm, (Oct. 20, 1997).

John Cooley, "Some Clever Memory BIST," EE Times: eeDesign News: Columns: Industry Gadfly (Sep. 5, 2000).

Robert Ristelhueber, "Built-In Self Test: Chip, test thyself: Semiconductor makers eye-built-in self-test to handle complex circuits," http://www.ee.pdx.edu/~mperkows/CLASS TEST/BIST/bist.html (Sep. 1997).

IEEE Standard Test Access Port and Boundary-Scan Architecture, IEEE Std 1149.1-2001 (Revision of IEEE Std 1149-,1.-1990), pp. i-vii, 1-200 (Jun. 14, 2001).

* cited by examiner

CONCURRENTLY PROGRAMMABLE DYNAMIC MEMORY BUILT-IN SELF-TEST (BIST)

FIELD OF INVENTION

The present invention generally relates to the field of circuit testing. More specifically, an embodiment of the present invention provides concurrently programmable dynamic built-in-self-test (BIST) of memory.

BACKGROUND OF INVENTION

As the complexity of integrated circuits (ICs) increases and access to their internal circuit nodes becomes harder, properly testing such devices becomes a major bottleneck during their prototyping, development, production, and maintenance. As a result, designs with BIST implementation have become commonplace. In a BIST implementation, circuitry (which is intended solely to support testing) is included in an IC or in a system including ICs.

The current generation of products involves integrating high numbers of memory modules. With the increasing need for bandwidth, the trend is to also increase the memory size. The resulting technology, in response to the challenge of integrating memory modules with increased sizes, introduces new failure modes. Because it is currently hard to predefine the type of defects, which can appear in these memory arrays, the current state of the art involves implementing several algorithms on chip, such as March C, checkerboard, and address uniqueness. This approach, however, can only provide a temporary solution since as the technology progresses the BIST algorithms need to be redesigned to take new memory defects into consideration as well as new requirements such as the need to initialize a particular array. Accordingly, this approach can be very expensive (e.g., in terms of development) and is partially ineffective (especially for memory modules that have already been fabricated).

SUMMARY OF INVENTION

The present invention includes novel methods and apparatus to efficiently provide concurrently programmable dynamic BIST of memory. In an embodiment of the present invention, a method of utilizing a built-in self-testing (BIST) system is disclosed. The method includes: loading setup data into a configuration register; loading a first instruction into a shift register; loading the first instruction into an update register; executing the loaded first instruction to perform a memory test; upon receiving a first update command, loading a second instruction into the shift register; and upon receiving a second update command, loading the second instruction into the update register.

In another embodiment of the present invention, the first update command may be received during an execution of the first instruction.

In a further embodiment of the present invention, the second update command may be received after a completion of the first instruction execution.

In yet another embodiment of the present invention, one or more of the loading acts may be performed by a BIST controller.

In a different embodiment of the present invention, the method may further include decoding the first instruction prior to performing the memory test.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art that embodiments of the invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

To provide access to BIST functionality on a chip, a test access port (TAP) may be utilized. TAP can be a general-purpose port that provides access to test support functions built into a component (such as that of Institute of Electrical and Electronics Engineers (IEEE) 1149.1 standard). Further information regarding the IEEE 1149.1 standard interface may be found in IEEE Standard Test Access Port and Boundary-Scan Architecture, IEEE Std. 1149.1-1990 (includes IEEE Std. 1149.1a-1993), Chapter 3, entitled "The Test Access Port," which is hereby incorporated herein for all purposes.

Figure 1:
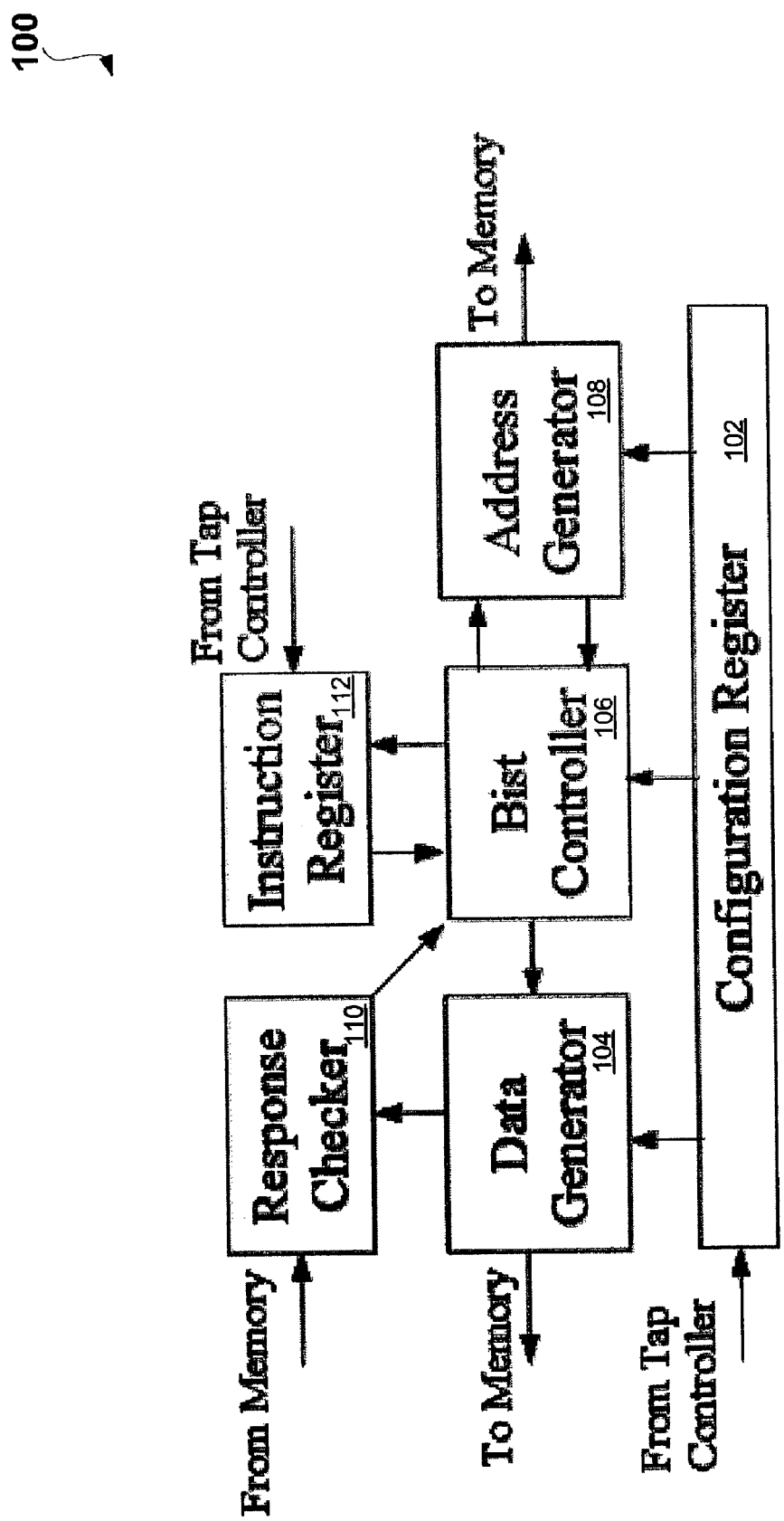
FIG. 1 illustrates an exemplary high-level BIST system 100 in accordance with an embodiment of the present invention.

FIG. 1 illustrates an exemplary high-level BIST system 100 in accordance with an embodiment of the present invention. In accordance with an embodiment of the present invention, the arrows shown in FIG. 1 indicate the direction of data flow. The BIST system 100 includes a configuration register 102, a data generator 104, a BIST controller 106, an address generator 108, a response checker 110, and an instruction register 112. The configuration register 102 receives data from a TAP controller (not shown) and sends data to one or more of the data generator 104, BIST controller 106, and address generator 108. As illustrated in FIG. 1, the data generator 104 receives data from the BIST controller and sends data to a memory module. The BIST controller 106 sends and receives data from the address generator 108, which, in turn, may communicate with the memory module. The response checker 110 is envisioned to compare the memory response to an expected response.

Furthermore, the response checker 110 receives data from the memory module and the data generator 104 and sends data to the BIST controller 106. The instruction register 112 receives data from the TAP controller, and sends and receives data to the BIST controller 106. Accordingly, the TAP controller may directly access the instruction register 112 and the configuration register 102, while the memory module receives data from the data generator 104 and/or the address generator 108. It is envisioned that in accordance with an embodiment of the present invention the BIST system 100 may be utilized for testing memory such as read-only memories (ROMs), random-access memories (RAMs), erasable programmable ROMs (EPROMs), electrically EPROMs (EEPROMs), internal/external cache, flash memory, or other types of memory module suitable for storing electronic instructions and/or data.

In an embodiment of the present invention, a standard IEEE 1149.1 configuration register 102 may be used to program the BIST system 100, for example, by utilizing a serial link synchronized to the internal core clock. In an embodiment of the present invention, it is envisioned that other types of links may be utilized to program the BIST system 100 such as Ethernet, Fast Ethernet, wireless, modem, cellular, universal serial bus (USB and its varieties such as USB II), and/or FireWire. In one embodiment of the present invention, the BIST system 100 may be implemented inside any application specific IC (ASIC) such as a central processing unit (CPU). The CPU may be a SPARC microprocessor available from several vendors (including Sun Microsystems of Santa Clara, Calif.).

Those with ordinary skill in the art understand, however, that any type of a CPU may be utilized to embody the present invention, including those made by Hewlett Packard of Palo Alto, Calif., and IBM-compatible personal computers utilizing Intel microprocessor, which are available from several vendors (including IBM of Armonk, N.Y.). In addition, instead of a single processor, two or more processors (whether on a single chip or on separate chips) can be utilized. It is further envisioned that the CPU may be a complex instruction set computer (CISC) microprocessor, a reduced instruction set computing (RISC) microprocessor, a very long instruction word (VLIW) microprocessor, a processor implementing a combination of instruction sets, and the like.

Figure 2:
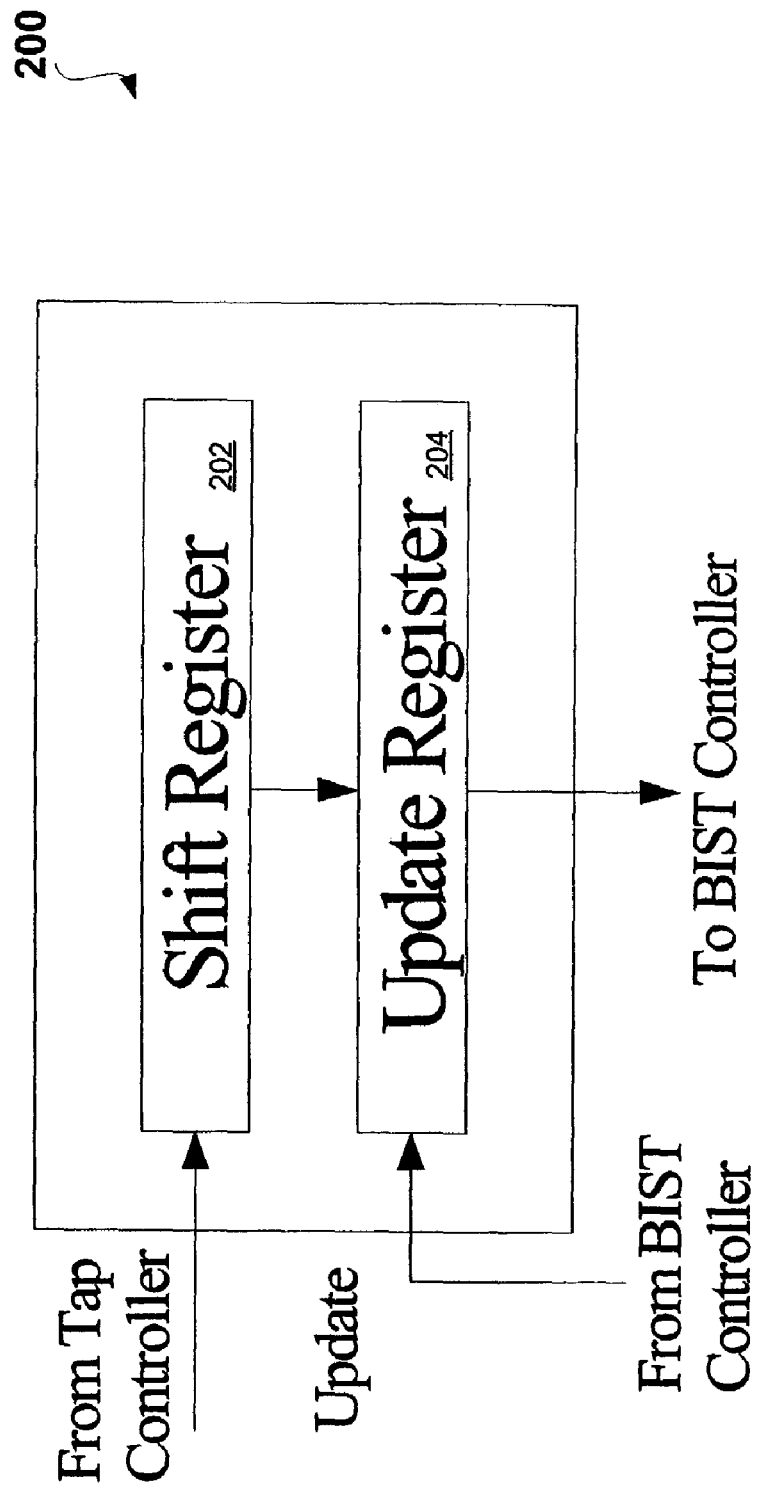
FIG. 2 illustrates an exemplary instruction register 200 in accordance with an embodiment of the present invention.

FIG. 2 illustrates an exemplary instruction register 200 in accordance with an embodiment of the present invention. In accordance with an embodiment of the present invention, the arrows shown in FIG. 2 indicate the direction of data flow. In a further embodiment of the present invention, the instruction register 200 may be the instruction register 112 of FIG. 1. The instruction register 200 includes a shift register 202 and an update register 204. The shift register 202 receives data from the TAP controller (not shown) and provides data to the update register 204. The update register also receives data from a BIST controller (such as the BIST controller 106 of FIG. 1). The update register 204 sends data to a BIST controller (such as the BIST controller 106 of FIG. 1).

In one embodiment of the present invention, the shift register 202 and the update register 204 may be five bits wide each. For example, three bits may be utilized for March element, one bit for up/down, and one bit for inversion. The shift register 202 (or instruction shift register (ISR)) may be used to program on the fly from a chip test interface (such as an IEEE 1149.1 TAP controller) an instruction to be executed next while the current instruction is executing. In one embodiment of the present invention, the ISR may be located inside the test controller's clock domain (i.e., low frequency). The update register 204 (or dynamic instruction register (DIR)) may hold the instruction that is being executed. Furthermore, the BIST kernel may contain a finite state machine (FSM) to decide the instruction and send the control signals to the BIST address generator (such as 108 of FIG. 1), data generator (such as 104 of FIG. 1), and data comparator (e.g., to compare expected data and data received from the memory module being tested). In one embodiment of the present invention, the data comparator may be implemented inside the response checker. When the execution of an instruction is near completion, the FSM may send an update signal to the ISR. Upon receipt of the update signal, the content of the ISR register may be loaded into the DIR and the new instruction begins execution.

In a further embodiment of the present invention, each of the shift register 202 and the update register 204 may be five bits wide. The first three bits may be utilized for March element such as:

| 001 | W   | W0     |
|-----|-----|--------|
| 010 | R   | R0     |
| 011 | RW  | R0W1   |
| 100 | WR  | W0R0   |
| 101 | RWR | R0W1R1,| where R stands for read, W stands for write, W0 stands for writing the data background, R0 stands for reading the memory value and comparing it to the data background, RW stands for read-write, WR stands for write-read, RWR stands for read-write-read, R0W1 stands for reading the memory value, comparing it to the data background, and writing the inverted data background, W0R0 stands for writing the data background, reading the memory value, and comparing it to the data background, and R0W1R1 stands for reading the memory value, comparing it to the data background, writing the inverted data background, reading the memory value, and comparing it to the inverted data background.

The fourth bit may be utilized for incrementation or decrementation. And the fifth bit may be utilized to select either to write/compare the data background or the inverted value of the background.

Figure 3:
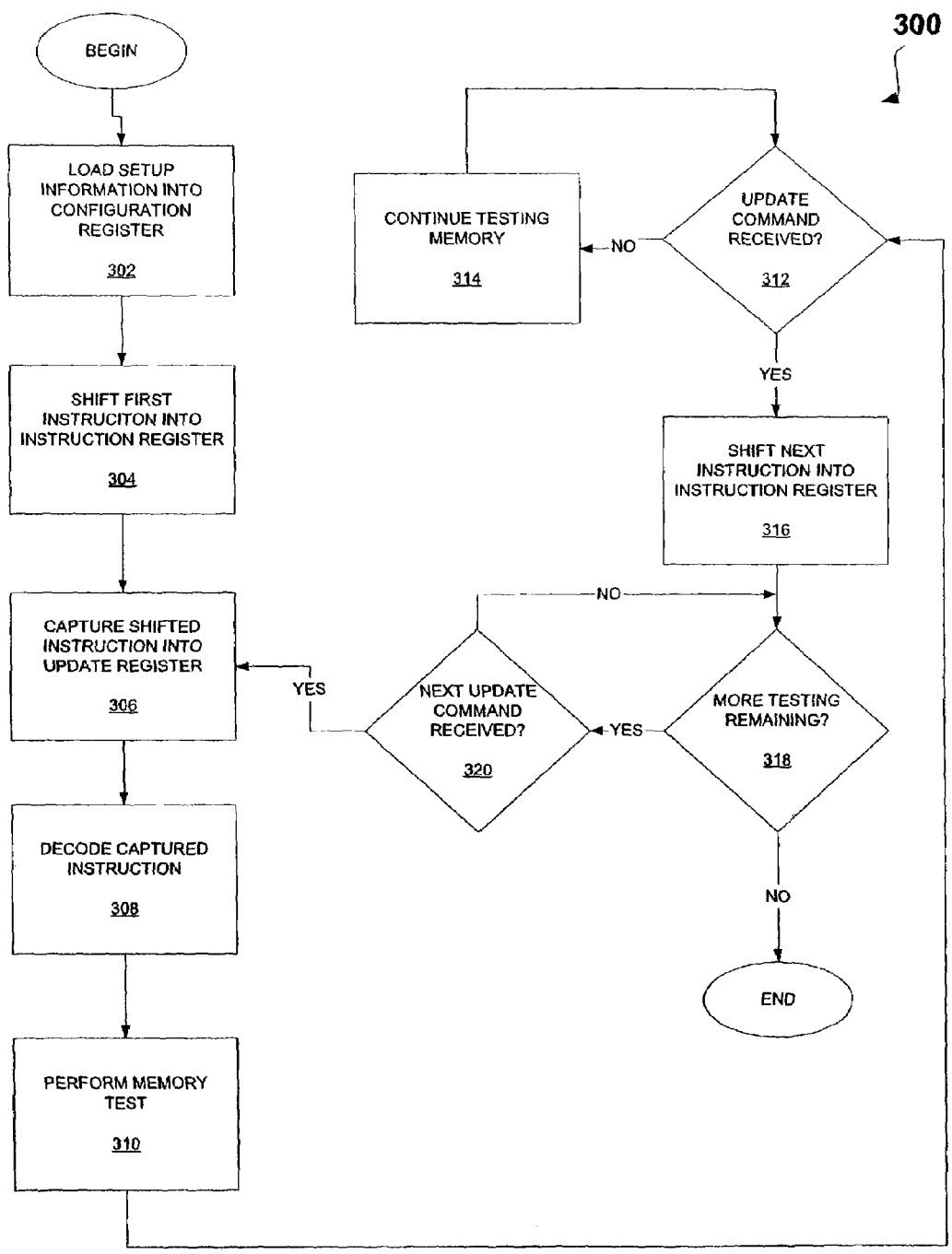
FIG. 3 illustrates an exemplary BIST operation method 300 in accordance with an embodiment of the present invention.

FIG. 3 illustrates an exemplary BIST operation method 300 in accordance with an embodiment of the present invention. In one embodiment of the present invention, the method 300 may be utilized to operate the BIST system 100 of FIG. 1 and/or the instruction register 200 of FIG. 2. The method 300 starts with a stage 302 that loads setup information into a configuration register (such as the configuration register 102 of FIG. 1). The stage 302 may occur after a chip reset in an embodiment of the present invention. The setup information may include data background, address range, checkerboard information, and the like. In one embodiment of the present invention, the loading may be accomplished by a private IEEE 1149.1 instruction.

In a further embodiment of the present invention, a data background register (not shown) can be coupled to an IEEE 1149.1 standard interface for programming (i.e., input) and connect to the output data of the BIST module (such as the BIST system 100 of FIG. 1). The data background register may hold the bit vector (or its inversion) that is written into the memory by the test algorithm. The width of the data background register can be the same as the data width of the memory, in an embodiment of the present invention. This value may also be used as expected data for comparison with data read from the memory. The data background can be programmable through the IEEE 1149.1 standard interface. This permits the user to perform March and checkerboard test algorithms with different data backgrounds to ensure relatively high-test coverage of the external memory.

In a further embodiment of the present invention, a second use of the data background register may include testing interconnects. A byproduct of writing the data background vector (held in the data background register) into the memory and later reading it back from the memory, is that the interconnects get tested at the same time. The defects covered by writing/reading a data background vector depends on the bit pattern seen at the interconnects, which in turn depends on the data background bit pattern. Due to the presence of logic (such as error correction code (ECC)) in between the data background register and the interconnects, the bit pattern held in the data background register may not be the same as those seen on the interconnects. In order to get high coverage of interconnect defects, it may therefore be necessary to construct an appropriate set of data background vectors. Given that little is known about the board and system level interconnects when designing a chip, it may be necessary to provide flexibility in defining this data background test suite.

In one embodiment of the present invention, the BIST system 100 of FIG. 1 may implement true checkerboard pattern testing by, for example, allowing consecutive addresses to write inversions of the programmed data background. In a further embodiment of the present invention, the data backgrounds for testing interconnects and memories may also be programmable. This fulfils requirements associated with high coverage memory tests that are independent of address and data scrambling.

The method 300 continues with a stage 304, which shifts the first instruction into an instruction register (such as the instruction register 112 of FIG. 1), for example, by utilizing the IEEE 1149.1 standard interface. The shifting of the first instruction may be accomplished by loading a new private instruction in accordance with the IEEE 1149.1 standard. In one embodiment of the present invention, the first instruction may be shifted into the shift register 202 of FIG. 2. In a stage 306, the shifted instruction is captured into an update register (such as the update register 204 of FIG. 2), for example, by going into the run-idle state from the IEEE 1149.1 interface. A stage 308 decodes the shifted instruction (e.g., by a decoder coupled to the shift register 202 and the update register 204 (not shown in FIG. 2)). Then, a stage 310 performs the memory test.

In a stage 312, it is determined whether an update command has been received. The update command may be issued by an address generator (such as the address generator 108 of FIG. 1) in accordance with an embodiment of the present invention. In a further embodiment of the present invention, the update command may be issued prior to completion of the first or prior instruction, for example, through detection done by knowing the address range. It is envisioned that in an embodiment of the present invention the update command may be sent to a BIST controller such as the BIST controller 106 of FIG. 1. If it is determined in the stage 312 that the update command is not yet received, the method 300 continues in a stage 314 (which continues the memory testing if not done).

Once the stage 312 determines that the update command has been received, the method 300 continues with a stage 316, which shifts the next instruction into the instruction register (such as discussed with respect to the stage 304). In a stage 318, it is determined whether more testing remains. If it is determined that no more testing remains, the method 300 terminates. Otherwise, the method 300 continues with a stage 320, which determines whether a next update command (such as that discussed with respect to the stage 312) is received. If not, the method 300 continues with the stage 318. Otherwise, the method 300 returns to the stage 306.

Accordingly, an embodiment of the present invention loads a next instruction to be executed while the current (e.g., first) instruction is being executed. When a BIST controller (such as the BIST controller 106 of FIG. 1) receives an update signal from, for example, an address generator (such as the address generator 108 of FIG. 1), it fetches the next instruction into an update register (such as the update register 204 of FIG. 2) and starts decoding the next instruction. Accordingly, the BIST system discussed herein is envisioned to be programmable on the fly, for example, by using the IEEE. 1149 TAP. And, during the execution of a memory test, new instructions may be shifted into the BIST system, which as a consequence may have an unlimited number of March elements encoded in the BIST controller, for example, to allow the generation of complex algorithms.

The foregoing description has been directed to specific embodiments. It will be apparent to those with ordinary skill in the art that modifications may be made to the described embodiments, with the attainment of all or some of the advantages. For example, the techniques of the present invention may be applied to very large-scale integrated (VLSI) logic and/or circuit modules. In addition, any type of memory or memory interconnect may be tested in accordance with various embodiments of the present invention regardless of the memory's logic, organization, and/or structure, for example.

Also, it is envisioned that even though only two registers are shown in the exemplary FIG. 2, additional registers may be utilized. For example, if the preparation (e.g., decoding and loading) stages take longer than the test performance stage, additional registers may be utilized to prepare (e.g., load and decode) more instructions to avoid having wait states. Therefore, it is the object of the appended claims to cover all such variations and modifications as come within the spirit and scope of the invention.

What is claimed is:

1. A method of utilizing a built-in self-testing (BIST) system, the method comprising:
    loading setup data into a configuration register of the BIST system to program the BIST system for a memory test;
    loading, based on the setup data, a first instruction for the memory test into a shift register of an instruction register of the BIST system;
    loading the first instruction into an update register of the instruction register of the BIST system;
    executing the loaded first instruction of the update register to perform the memory test;
    upon receiving an update command to reprogram the memory test, loading a second instruction into the shift register, wherein the second instruction to perform a reprogrammed version of the memory test; and
    upon completion of the execution of the first instruction, loading the second instruction into the update register to be executed.

2. The method of claim 1 wherein the update command is received during an execution of the first instruction.

3. The method of claim 1 wherein the update command is received after a completion of the first instruction execution.

4. The method of claim 1 wherein the update command is received by a BIST controller.

5. The method of claim 1 wherein one or more of the loading acts is performed by a BIST controller.

6. The method of claim 1 further including decoding the first instruction prior to performing the memory test.

7. The method of claim 1 wherein the setup data is selected from a group comprising data background, address range, and checkerboard.

8. The method of claim 1 wherein the BIST system is provided in compliance with IEEE 1149.1 standard.

9. The method of claim 1 wherein each of the shift register and the update register are at least five bits wide.

10. The method of claim 1 wherein the shift register and the update register have a same width.

11. A built-in self-testing (BIST) system comprising:
a BIST controller to manage a memory test of the BIST system;
an update register coupled to the BIST controller to store a first instruction to perform the memory test;
an address generator coupled to the BIST controller to provide an update command to reprogram the memory test;
a shift register coupled to the update register and an interface controller, the shift register storing a second instruction to perform a reprogrammed version of the memory test to be executed after the first instruction,
wherein the address generator sends the update command to the BIST controller prior to a completion of the first instruction execution to indicate that the second instruction is to be loaded into the shift register.

12. The system of claim 11 wherein the interface controller is provided in compliance with IEEE 1149.1 standard.

13. The system of claim 11 wherein the BIST controller is implemented inside a CPU.

14. The system of claim 13 wherein the CPU is selected from a group comprising CISC, VLIW, and RISC processors.

15. The system of claim 11 further including a data generator, a response checker, and a configuration register.

16. The system of claim 15 wherein the configuration register stores setup data.

17. The system of claim 16 wherein the setup data is selected from a group comprising data background, address range, checkerboard data.

18. The system of claim 15 wherein the response checker further includes a comparator to compare expected data and data received from a memory module being tested by the BIST system.

19. A built-in self-testing (BIST) system comprising:
means for loading setup data into a configuration register of the BIST system to program the BIST system for a memory test;
means for loading, based on the setup data, a first instruction for the memory test into a shift register of an instruction register of the BIST system;
means for loading the first instruction into an update register of the instruction register of the BIST system;
means for executing the loaded first instruction of the update register to perform the memory test;
upon receiving an update command to reprogram the memory test, means for loading a second instruction into the shift register, wherein the second instruction to perform a reprogrammed version of the memory test; and
upon completion of the execution of the first instruction, means for loading the second instruction into the update register to be executed.

20. The system of claim 19 further including means for decoding the first instruction prior to performing the memory test.

* * * * *